(12) United States Patent
Liu et al.

(10) Patent No.: US 7,172,909 B2
(45) Date of Patent: Feb. 6, 2007

(54) LIGHT EMITTING DIODE HAVING AN ADHESIVE LAYER AND A REFLECTIVE LAYER AND MANUFACTURING METHOD THEREOF

(75) Inventors: Wen-Huang Liu, Hsin-Chu (TW); Tzu-Feng Tseng, Hsin-Chu (TW); Min-Hsun Hsieh, Hsin-Chu (TW); Ting-Wei Yeh, Hsin-Chu (TW); Jen-Shui Wang, Hsin-Chu (TW)

(73) Assignee: Epistar Corporation, Hsinchu (TW)

( * ) Notice: Subject to any disclaimer, the term of this patent is extended or adjusted under 35 U.S.C. 154(b) by 266 days.

(21) Appl. No.: 10/904,185

(22) Filed: Oct. 28, 2004

(65) Prior Publication Data
US 2005/0079641 A1    Apr. 14, 2005

Related U.S. Application Data

(62) Division of application No. 10/604,245, filed on Jul. 4, 2003, now Pat. No. 6,987,287.

(51) Int. Cl.
*H01L 33/00* (2006.01)
(52) U.S. Cl. ............... 438/26; 438/455; 257/E33.068
(58) Field of Classification Search ........ 257/E33.067, 257/E33.068, E33.071, E33.072; 438/26, 438/27
See application file for complete search history.

(56) References Cited

U.S. PATENT DOCUMENTS 5,376,580 A    12/1994    Kish et al.
5,798,536 A    8/1998    Tsutsui
6,180,963 B1    1/2001    Arai
6,287,882 B1    9/2001    Chang et al.
6,320,206 B1    11/2001    Coman et al.
6,416,194 B1    7/2002    Demiryont
6,597,019 B2    7/2003    Inoue et al.
6,682,950 B2    1/2004    Yang et al.
2002/0053872 A1    5/2002    Yang et al.
2002/0080836 A1*    6/2002    Hwang .................... 372/45
2002/0105003 A1    8/2002    Yang et al.

(Continued)

FOREIGN PATENT DOCUMENTS

DE    10118447 A1    5/2002

(Continued)

OTHER PUBLICATIONS

Chua, C.L. et al., "Dielectrically-Bonded Long Wavelength Vertical Cavity Laser on GaAs Substrates Using Strain-Compensated Multiple Quantum Wells," IEEE Photonics Technology Letters, vol. 6, No. 12, pp. 1400-1402, Dec. 1994.*

(Continued)

*Primary Examiner*—Carl Whitehead, Jr.
*Assistant Examiner*—Jennifer M. Dolan
(74) *Attorney, Agent, or Firm*—Winston Hsu

(57) ABSTRACT

A light emitting diode having an adhesive layer and a reflective layer and a manufacturing method thereof featured by adhering together a light emitting diode stack and a substrate having a reflective metal layer by use of a transparent adhesive layer so that the light rays directed to the reflective metal layer can be reflected therefrom to improve the brightness of the light emitting diode.

12 Claims, 7 Drawing Sheets

U.S. PATENT DOCUMENTS

| | | | |
|---|---|---|---|
| 2003/0040133 A1* | 2/2003 | Horng et al. ............... 438/22 |
| 2003/0087463 A1* | 5/2003 | Horng et al. ............... 438/29 |
| 2003/0155579 A1* | 8/2003 | Yang ........................ 257/88 |
| 2003/0168664 A1 | 9/2003 | Hahn et al. |
| 2004/0124428 A1* | 7/2004 | Lin et al. .................. 257/90 |

FOREIGN PATENT DOCUMENTS

| | | |
|---|---|---|
| JP | 52-23986 | 6/1977 |
| JP | 57-10280 | 1/1982 |
| JP | 8-330624 | 12/1996 |
| JP | 11-168236 | 6/1999 |
| JP | 2000-91628 | 3/2000 |
| JP | 2000091628 A1 | 3/2000 |
| JP | 2000-228563 | 8/2000 |

OTHER PUBLICATIONS

Chen-Fu Chu et al., Fabrication and Characteristics of Freestanding GaN light emitting Devices by Laser Lift-off Technique, Proceedings of Opto-Electronics and Communications Conference. Jul. 8, 2002, No. 87, Yokohama, Japan.

F. S. Shieu et al., Effect of a Ti interlayer on the bond strength and thermal stability of the Cu/benzocyclobutene-divinyl tetramethyldisiloxane Interface, J. Adhesion Sci. Technol., 1998, pp. 19-28, vol. 12, No. 1, VSP, Netherlands.

R. H. Horng et al., AlGaInP light-emitting diodes with mirror substrates fabricated by wafer bonding, Applied Physics Letters, Nov. 15, 1999, pp. 3054-3056, vol. 75, No. 20, American Institute of Physics, USA.

G. Dang et al., Comparison of Dry and Wet Etch Processes for Patterning SiO2/TiO2 Distributed Bragg Reflectors for Vertical-Cavity Surface-Emitting Lasers, Journal of The Electrochemical Society, 2001, G25-G28, vol. 148(2), The Electrochemical Society, Inc., NJ, USA.

T. Margalith et al., Indiumtin oxidecontacts to gallium nitride optoelectronic devices, Applied Physics Letters, Jun. 28, 1999, pp. 3930-3932, vol. 74, No. 26, American Institute of Physics, USA.

R. H. Horng et al, "AlGaInP light-emitting diodes with mirror substrates fabricated by wafer bonding." Appl. Phys. Lett., Nov. 15, 1999, pp. 3054-3056, vol. 75, No. 20.

\* cited by examiner

LIGHT EMITTING DIODE HAVING AN ADHESIVE LAYER AND A REFLECTIVE LAYER AND MANUFACTURING METHOD THEREOF

CROSS REFERENCE TO RELATED APPLICATIONS

This application is a division of U.S. application Ser. No. 10/604,245 filed Jul. 4, 2003 now U.S. Pat. No. 6,987,287.

BACKGROUND OF INVENTION

1. Field of the Invention

The present invention relates to a light emitting diode and the manufacturing method thereof. More particularly, the invention is directed to a light emitting diode having an adhesive layer and a reflective layer and the manufacturing method thereof.

2. Description of the Prior Art

Light emitting diodes can be used in a wide variety of devices, for example, optical displays, traffic lights, data storage devices, communication devices, illumination devices, and medical devices. To manufacture a light emitting diode of higher brightness is an important task of engineers.

A prior art method for improving LED brightness involves bonding two semiconductor parts together by van der Waals forces. However, it has a disadvantage in that van der Waals forces are too weak to provide a sufficient mechanical bonding strength between the two parts and therefore they are apt to separate.

In U.S. Pat. No. 5,376,580, a method for bonding an LED stack and a transparent substrate to create an ohmic interface therebetween is disclosed. The transparent substrate can be made of GaP. The light generated from the LED stack can pass through the LED stack as well as the transparent substrate. However, this prior art method has to be carried out at about 1000° C. by exerting a coaxial compressive force on the LED stack and the transparent substrate to form an ohmic interface therebetween. The primary disadvantage of this prior art method lies in that the property of the LED is destroyed by the high temperature during the manufacturing process and this results in an LED of low light emitting efficiency. In addition, the transparent GaP substrate has a color and a transparency of only about 60–70%. It therefore reduces brightness of the LED.

Another prior art method for improving LED brightness involves a bonding technique using a metal layer to bond an LED stack and a substrate. The metal layer forms a bonding layer and a mirror through its metallic property. Thereby, the light rays emitted from the LED stack can be reflected at the metal layer and re-enter the LED stack without passing through the metal layer and entering the substrate. The disadvantage that the some light rays are absorbed by a substrate can therefore be avoided. In such a manufacturing process, the bonding temperature of the metal layer is only about 300–450° C. The LED property will not be destroyed at these low temperatures. However, this bonding technique involves a few disadvantages. One of the disadvantages lies in that although a low bonding temperature will not cause any reaction between the metal layer and any of the two semiconductor layers to be bonded and therefore a highly reflective metal surface (reflectivity over 90%) and improved light emitting efficiency can be obtained, the bonding effect is not sufficient due to that there is no reaction between the metal layer and any of the semiconductor layers to be bonded, and an ohmic interface cannot be formed between the metal layer and any of the semiconductor layers to be bonded. Nevertheless, in case that a higher bonding temperature is adopted, the bonding between the metal layer and any of the two semiconductor layers to be bonded is good. However, the reflectivity of the reflective metal layer will be greatly reduced and therefore the metal layer cannot provide a good mirror function. This is another disadvantage of the bonding technique.

To avoid the aforementioned disadvantages, the inventors of the present application got an inventive concept to be explained in the following. In case a transparent adhesive layer is used for adhering a metal layer, as mentioned above, to an LED stack, light rays generated by the LED stack may pass through the transparent adhesive layer, be reflected by the metal layer, and then pass through the LED stack. However, if the metal layer is simply adhered to the LED stack by use of an adhesive layer, the adhesion between them is achieved only by van der Waals forces and peeling is apt to occur at the adhesion interface. The inventive concept lies in that a reaction layer is formed between the transparent adhesive layer and any of the LED stack and the metal layer, wherein a reaction occurs between the reaction layer and the transparent adhesive layer so that hydrogen bonds or ionic bonds are formed to enhance the bonding forces provided by the transparent adhesive layer. Thereby, the transparent adhesive layer can provide an enhanced mechanical strength and thus the above-mentioned disadvantage of peeling can be avoided. In addition, using the transparent adhesive layer can avoid the above-mentioned disadvantage caused by the bonding between the metal layer and the LED stack. Moreover, a transparent conductive layer can be formed between the transparent adhesive layer and the LED stack for improving the efficiency of current spreading and thereby can enhance the brightness of the LED.

SUMMARY OF INVENTION

An object of the invention is to provide a light emitting diode having an adhesive layer and a reflective layer and the manufacturing method thereof. In the manufacturing method, a transparent adhesive layer is used to bond an LED stack and a substrate having a reflective layer so that light can pass through the transparent adhesive layer and reflected at the reflective layer. On each of the upper and lower surfaces of the transparent adhesive layer is formed a reaction layer. The reaction layer creates reaction when it and the transparent adhesive layer is pressurized and heated to enhance the bonding forces at the adhesive surface for improving mechanical strength. The light directed to the reflective layer is reflected out to increase the brightness of the light emitting diode. Additionally, the reflective layer can also be formed between the LED stack and the reaction layer so that the adhesive layer does not have to be limited to a transparent adhesive layer and light directed to the reflective layer can be reflected out even a non-transparent adhesive layer is used. This method does not have any problems relating the decrease in reflectivity and decrease in bonding effect. Thereby, an effect of total reflection can be obtained and the object of increasing the brightness of an LED can be achieved.

A light emitting diode having an adhesive layer and a reflective layer in accordance with a preferred embodiment of the invention comprises a second substrate, a reflective metal layer formed on the second substrate, a first reaction layer formed on the reflective metal layer, a transparent adhesive layer formed on the first reaction layer, a second reaction layer formed on the transparent adhesive layer, a transparent conductive layer formed on the second reaction layer, wherein the upper surface of the transparent conductive layer consists of a first surface area and a second surface area. A first contact layer is formed on the first surface area. A first cladding layer is formed on the first contact layer. An active layer is formed on the first cladding layer. A second cladding layer is formed on the active layer. A second contact layer is formed on the second cladding layer. A first electrode is formed on the second contact layer. A second electrode is formed on the second surface area.

The manufacturing method of a light emitting diode in accordance with a preferred embodiment of the invention comprises the following steps: forming in sequence, on a first substrate, a second contact layer, a second cladding layer, an active layer, a first cladding layer, a first contact layer, a transparent conductive layer, a second reaction layer to constitute a first stack; forming a reflective metal layer on a second substrate and forming a first reaction layer on the reflective metal layer to constitute a second stack; providing a transparent adhesive layer and using the transparent adhesive layer to bind together the first stack and the second stack by adhering it to the surface of the second reaction layer and the surface of the first reaction layer to constitute a third stack; removing the first substrate to constitute a fourth stack; suitably etching the fourth stack to the transparent conductive layer to form an exposed surface area of the transparent conductive layer; and forming a first electrode on the second contact layer and a second electrode on the exposed surface area of the transparent conductive layer.

DETAILED DESCRIPTION

Figure 1:
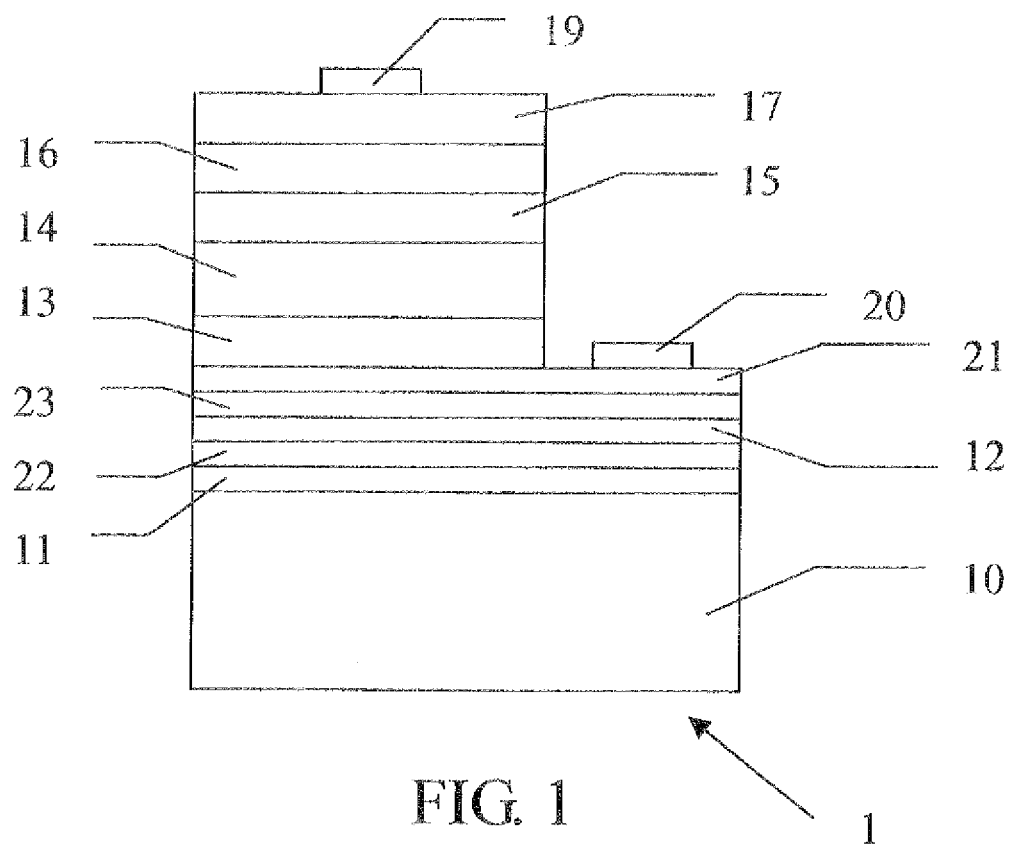
FIG. 1 is a schematic diagram showing a light emitting diode having an adhesive layer and a reflective layer in accordance with a preferred embodiment of the invention.
Figure 2:
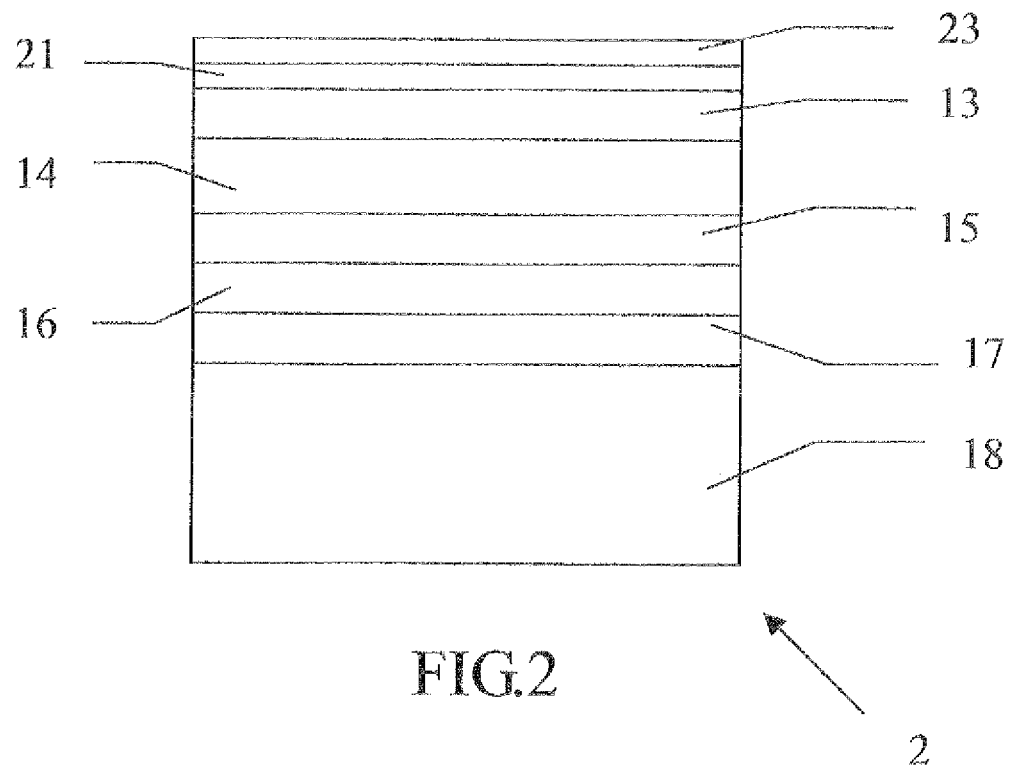
FIG. 2 is a schematic diagram showing a first stack for use in a method for manufacturing a light emitting diode having an adhesive layer and a reflective layer, as shown in FIG. 1, in accordance with the invention.

Referring to FIG. 1, a light emitting diode having an adhesive layer and a reflective layer 1 in accordance with a preferred embodiment of the invention comprises a second substrate 10, a reflective metal layer 111 formed on the second substrate 10, a first reaction layer 22 formed on the reflective metal layer 11, a transparent adhesive layer 12 formed on the first reaction layer 22, a second reaction layer 23 formed on the transparent adhesive layer 12, a transparent conductive layer 21 formed on the second reaction layer 23, wherein the upper surface of the transparent conductive layer 21 consists of a first surface area and a second surface area. A first contact layer 13 is formed on the first surface area. A first cladding layer 14 is formed on the first contact layer 13. An active layer 15 is formed on the first cladding layer 14. A second cladding layer 16 is formed on the active layer 15. A second contact layer 17 is formed on the second cladding layer 16. A first electrode 19 is formed on the second contact layer 17. A second electrode 20 is formed on the second surface area.

Figure 3:
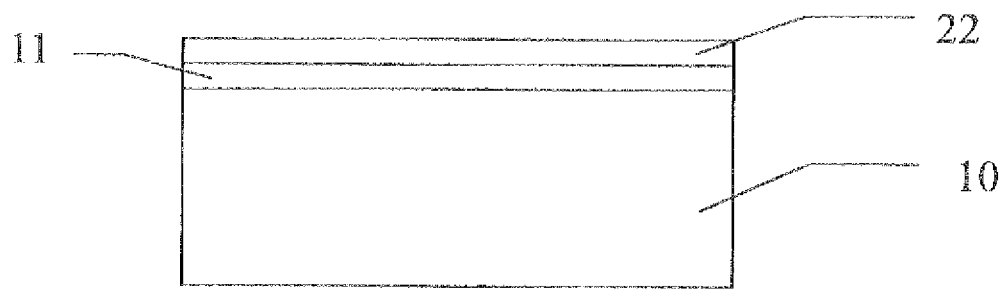
FIG. 3 is a schematic diagram showing a second stack for use in a method for manufacturing a light emitting diode having an adhesive layer and a reflective layer, as shown in FIG. 1, in accordance with the invention.
Figure 4:
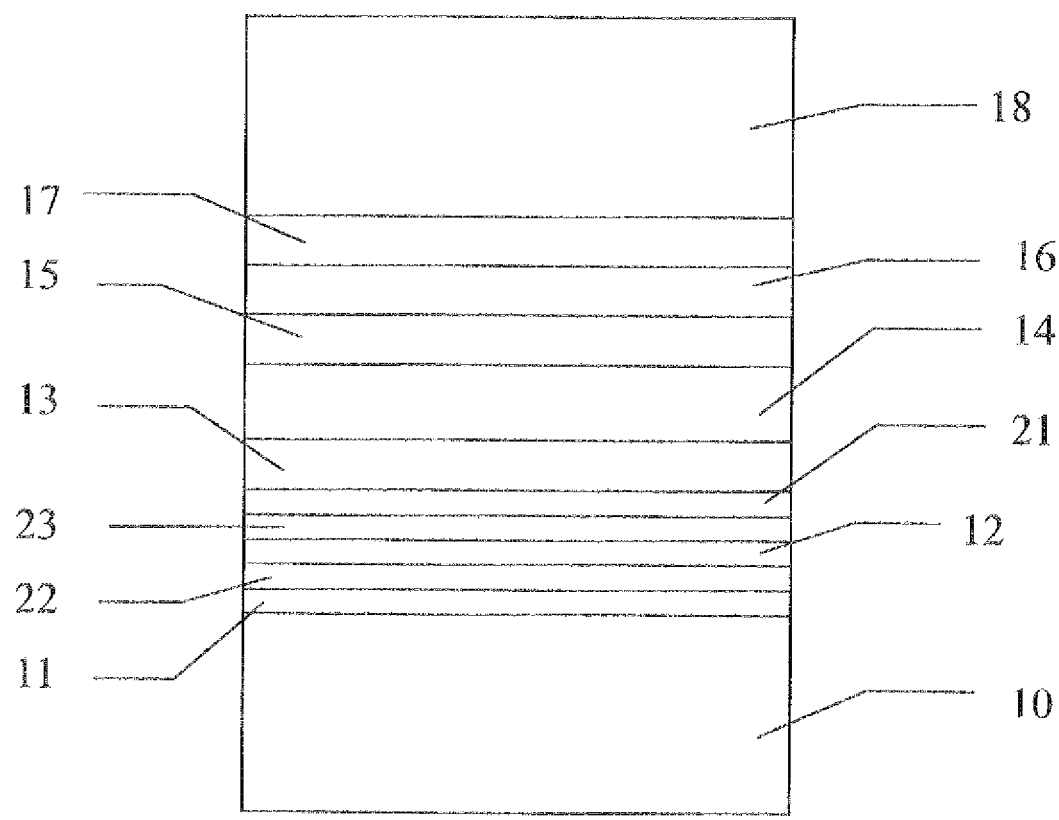
FIG. 4 is a schematic diagram showing a third stack formed, after adhesive binding the first stack and the second stack and before removing the first substrate, in a method for manufacturing a light emitting diode having an adhesive layer and a reflective layer, as shown in FIG. 1, in accordance with the invention.
Figure 5:
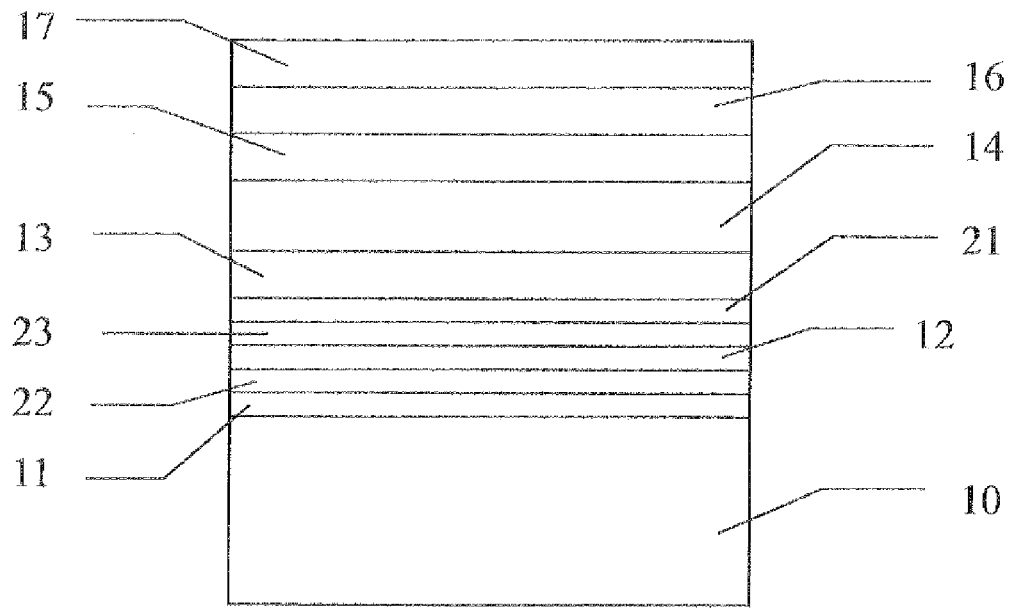
FIG. 5 is a schematic diagram showing a fourth stack formed, after removing the first substrate, in a method for manufacturing a light emitting diode having an adhesive layer and a reflective layer, as shown in FIG. 1, in accordance with the invention.

Referring to FIGS. 1 to 5, the manufacturing method of the light emitting diode 1 comprises the following steps: forming in sequence, on a first substrate 18, a second contact layer 17, a second cladding layer 16, an active layer 15, a first cladding layer 14, a first contact layer 13, a transparent conductive layer 21, a second reaction layer 23 to constitute a first stack 2; forming a reflective metal layer 111 on a second substrate 10 and forming a first reaction layer 22 on the reflective metal layer 11 to constitute a second stack 3, as shown in FIG. 3; providing a transparent adhesive layer 12 and using the transparent adhesive layer 12 to bind together the first stack 2 and the second stack 3 by adhering it to the surface of the second reaction layer 23 and the surface of the first reaction layer 22 to constitute a third stack 4, as shown in FIG. 4; removing the first substrate 18 to constitute a fourth stack 5, as shown in FIG. 5; suitably etching the fourth stack 5 to the transparent conductive layer 21 to form an exposed surface area of the transparent conductive layer 21; and forming a first electrode 19 on the second contact layer 17 and a second electrode 20 on the exposed surface area of the transparent conductive layer 21.

Figure 6:
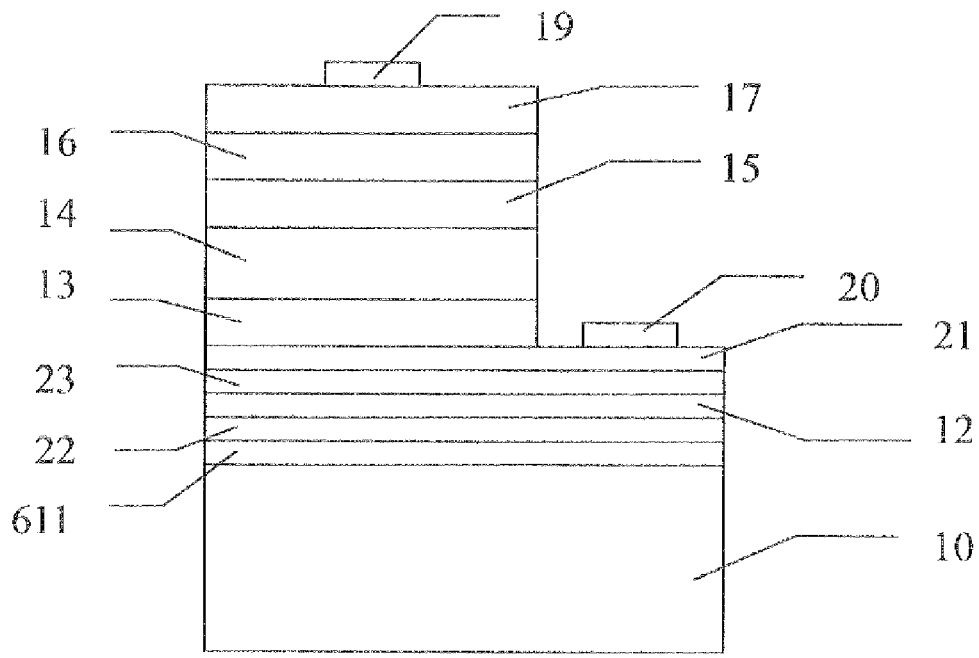
FIG. 6 is a schematic diagram showing a light emitting diode having an adhesive layer and a reflective layer in accordance with another preferred embodiment of the invention.

A light emitting diode having an adhesive layer and a reflective layer 6 in accordance with another preferred embodiment of the invention is shown in FIG. 6. The LED structure and manufacturing method of this LED 6 is similar to that in accordance with the aforementioned preferred embodiment except that the reflective metal layer 111 is replaced by a reflective oxide layer 611 by which the light directed to the reflective oxide layer 611 can be reflected and taken out.

Figure 7:
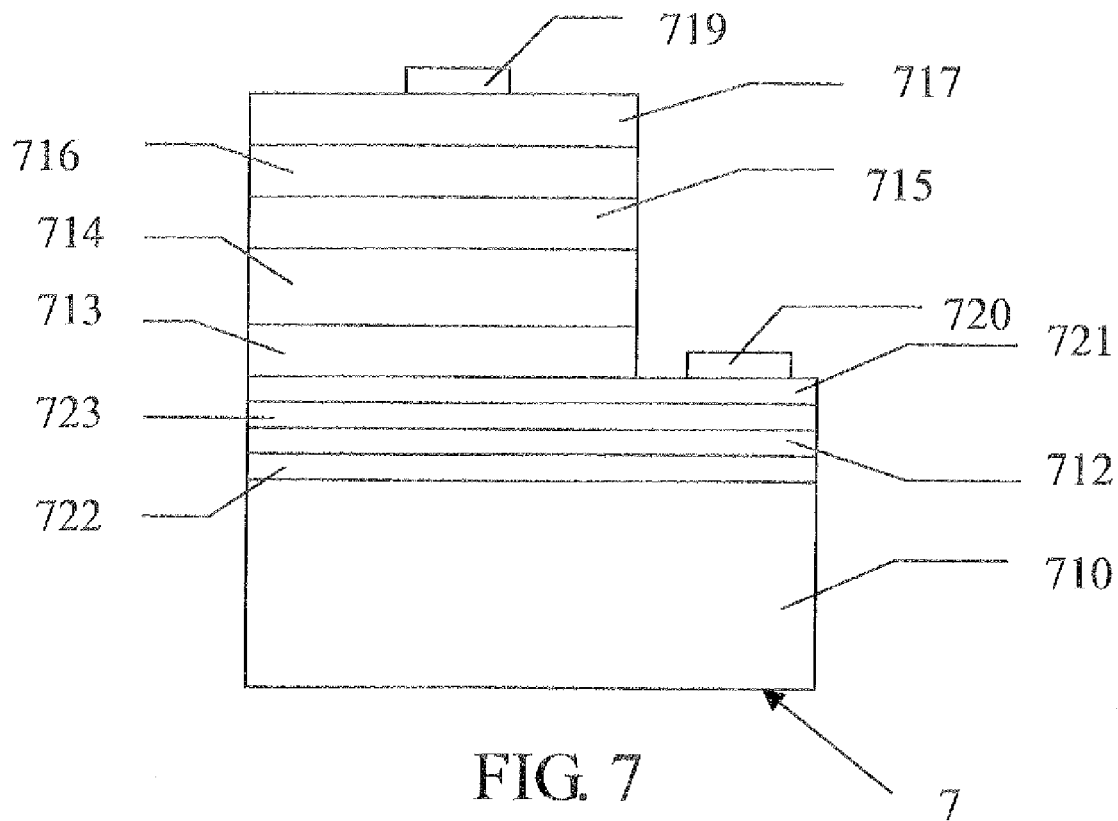
FIG. 7 is a schematic diagram showing a light emitting diode having an adhesive layer and a reflective layer in accordance with yet another preferred embodiment of the invention.
Figure 8:
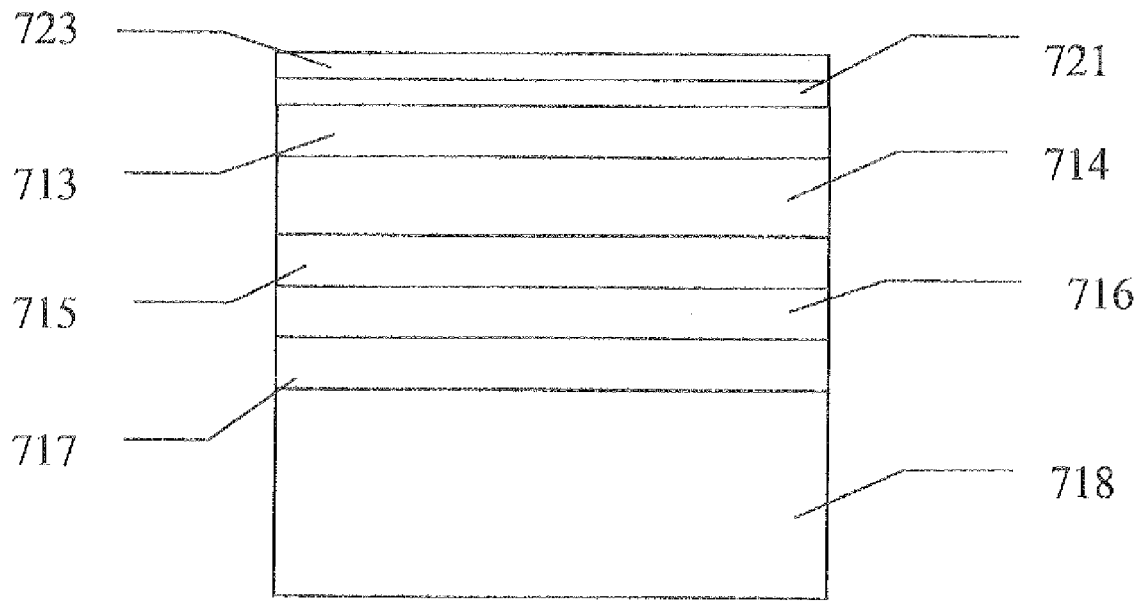
FIG. 8 is a schematic diagram showing a fifth stack for use in a method for manufacturing a light emitting diode having an adhesive layer and a reflective layer, as shown in FIG. 7, in accordance with the invention.
Figure 9:
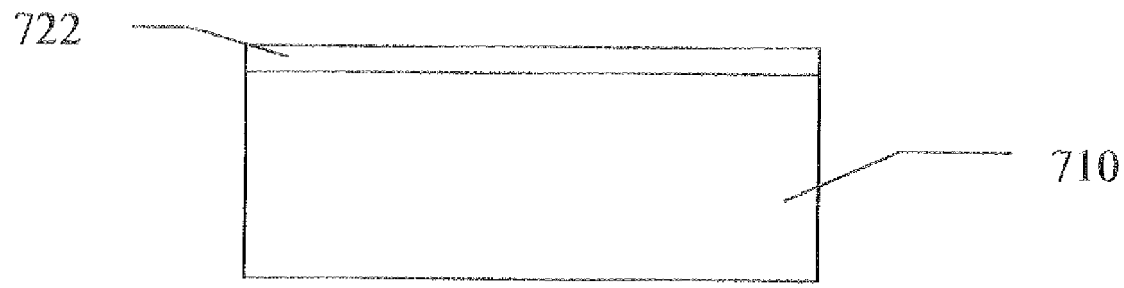
FIG. 9 is a schematic diagram showing a sixth stack for use in a method for manufacturing a light emitting diode having an adhesive layer and a reflective layer, as shown in FIG. 7, in accordance with the invention.
Figure 10:
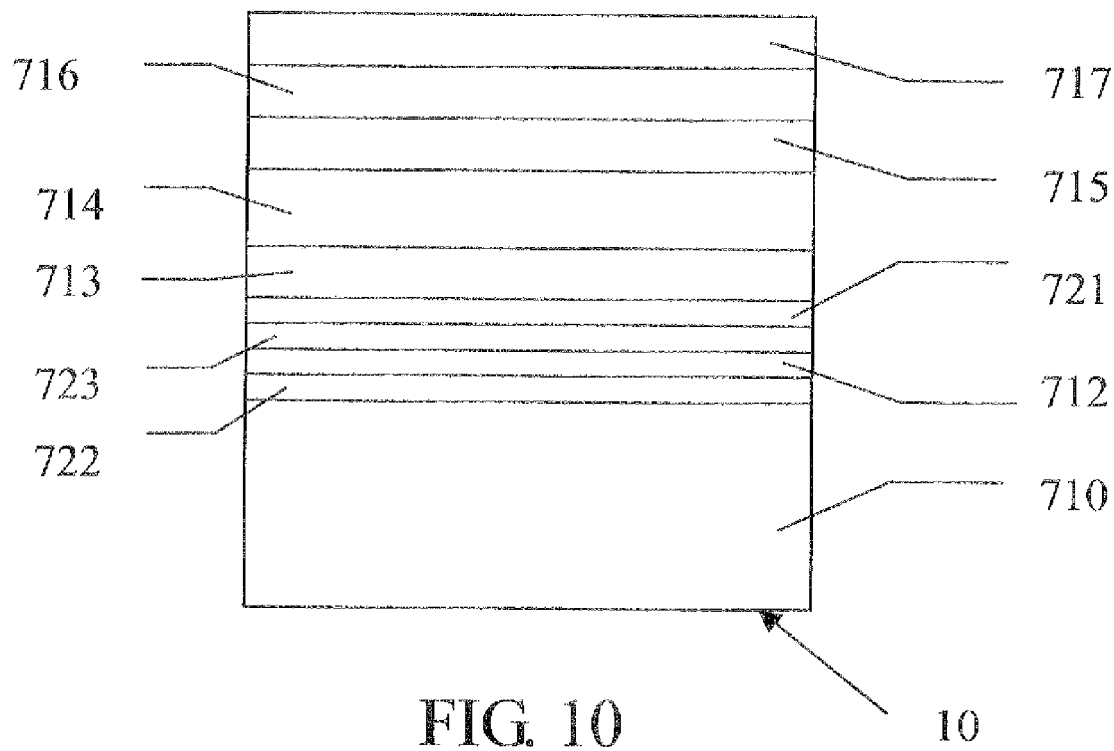
FIG. 10 is a schematic diagram showing a seventh stack formed, after adhesive binding the first stack and the second stack and before removing the first substrate, in a method for manufacturing a light emitting diode having an adhesive layer and a reflective layer, as shown in FIG. 7, in accordance with the invention.

Referring to FIG. 7, a light emitting diode having an adhesive layer and a reflective layer 7 in accordance with yet another preferred embodiment of the invention comprises a reflective metal substrate 710; a first reaction layer 722 formed on the reflective metal substrate 710; a transparent adhesive layer 712 formed on the first reaction layer 722; a second reaction layer 723 formed on the transparent adhesive layer 712; a transparent conductive layer 721 formed on the second reaction layer 723; wherein the transparent conductive layer 721 comprises a first surface area and a second surface area; a first contact layer 713 formed on the first surface area; a first cladding layer 714 formed on the first contact layer 713; an active layer 715 formed on the first cladding layer 714; a second cladding layer 716 formed on the active layer 715; a second contact layer 717 formed on the second cladding layer 716; a first electrode 719 formed on the second contact layer 717; and the second electrode 720 formed on the second surface area.

Referring to FIGS. 7 to 10, the manufacturing method of the LED 7 comprises the following steps: forming in sequence, on a first substrate 718, a second contact layer 717, a second cladding layer 716, an active layer 715, a first cladding layer 714, a first contact layer 713, a transparent conductive layer 721, a second reaction layer 723 to constitute a fifth stack 8; forming a first reaction layer 722 on a reflective metal substrate 710 to constitute a sixth stack 9; bonding the surface of the second reaction layer of the first stack with the surface of the first reaction layer of the sixth stack by use of a transparent adhesive layer 712; removing the first substrate 718 to leave a seventh stack 100; suitably etching the seventh stack 100 to form an exposed surface area of the transparent conductive layer 721; and forming a first electrode 719 and a second electrode 720 respectively on the second contact layer 717 and the exposed surface area of the transparent conductive layer 721.

Figure 11:
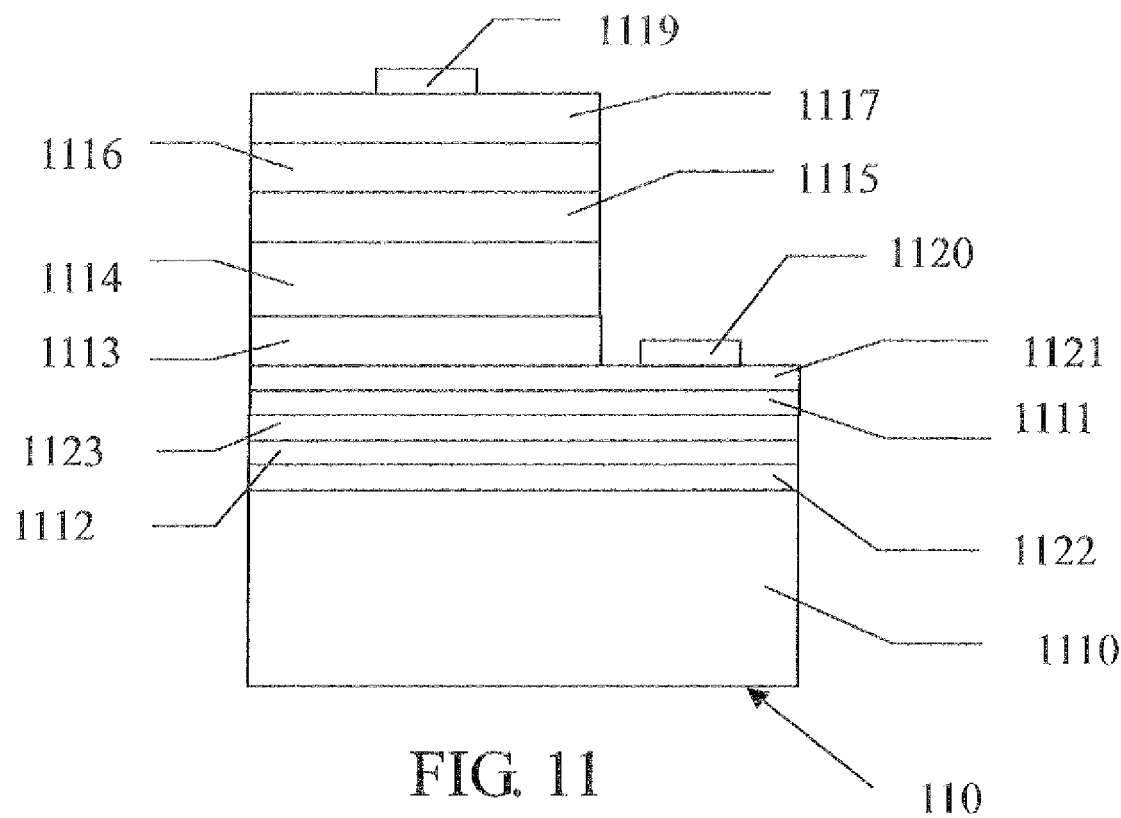
FIG. 11 is a schematic diagram showing a light emitting diode having an adhesive layer and a reflective layer in accordance with still yet another preferred embodiment of the invention.

Referring to FIG. 11, a light emitting diode 110 in accordance with another preferred embodiment of the invention comprises a second substrate 1110; a first reaction layer 1122 formed on the second substrate 1110; an adhesive layer 1112 formed on the first reaction layer 1122; a second reaction layer 1123 formed on the adhesive layer 1112; a reflective metal layer 1111 formed on the second reaction layer 1123; a transparent conductive layer 1121 formed on the reflective metal layer 1111, wherein the transparent conductive layer 1121 comprises a first surface area and a second surface area; a first contact layer 1113 formed on the first surface area; a first cladding layer 1114 formed on the first contact layer 1113; an active layer 1115 formed on the first cladding layer 1114; a second cladding layer 1116 formed on the active layer 1115; a second contact layer 1117 formed on the second cladding layer 1116; a first electrode 1119 formed on the second contact layer 1117; and a second electrode 1120 formed on the second surface area.

Figure 12:
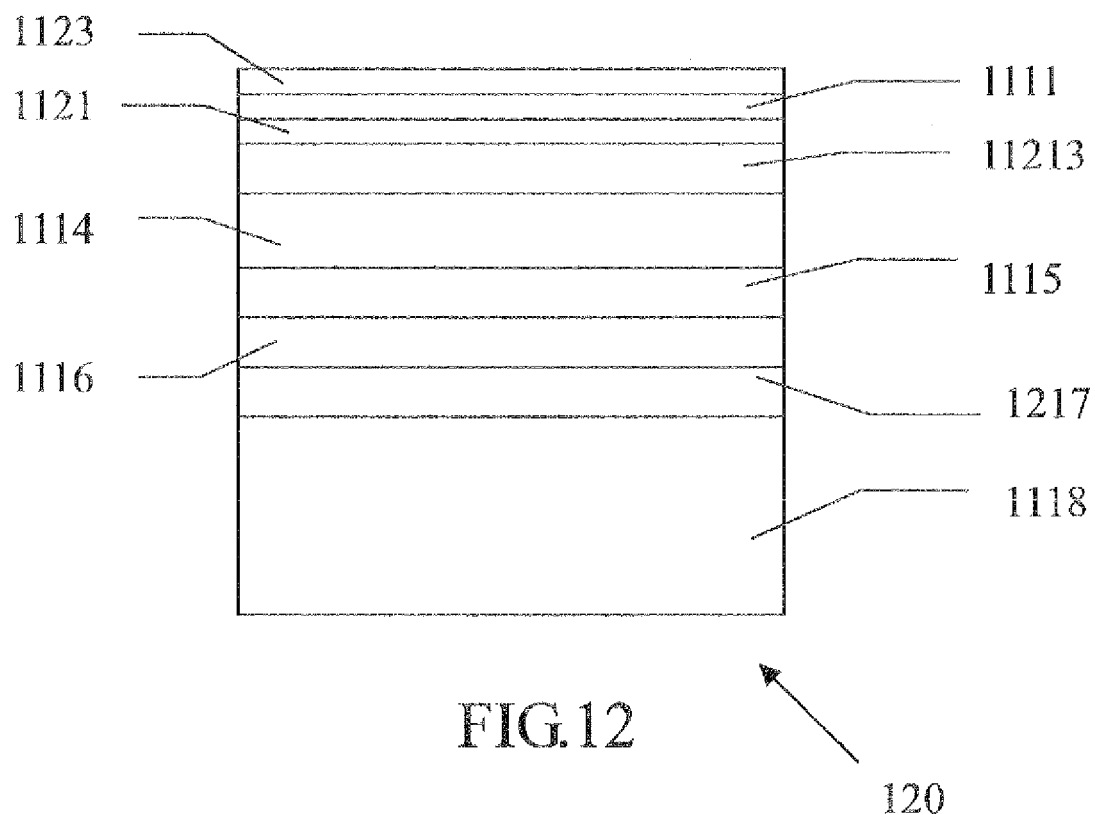
FIG. 12 is a schematic diagram showing a eighth stack for use in a method for manufacturing a light emitting diode having an adhesive layer and a reflective layer, as shown in FIG. 11, in accordance with the invention.
Figure 13:
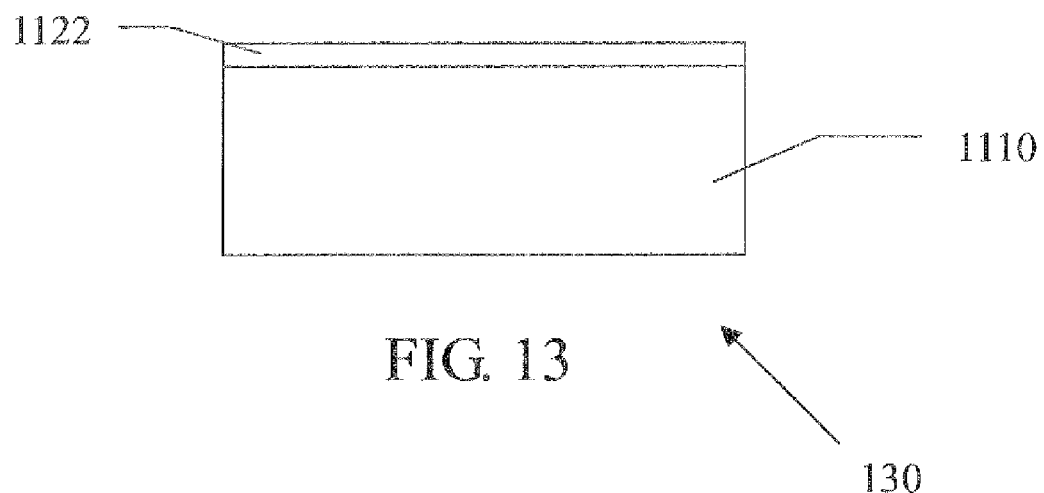
FIG. 13 is a schematic diagram showing a ninth stack for use in a method for manufacturing a light emitting diode having an adhesive layer and a reflective layer, as shown in FIG. 11, in accordance with the invention.
Figure 14:
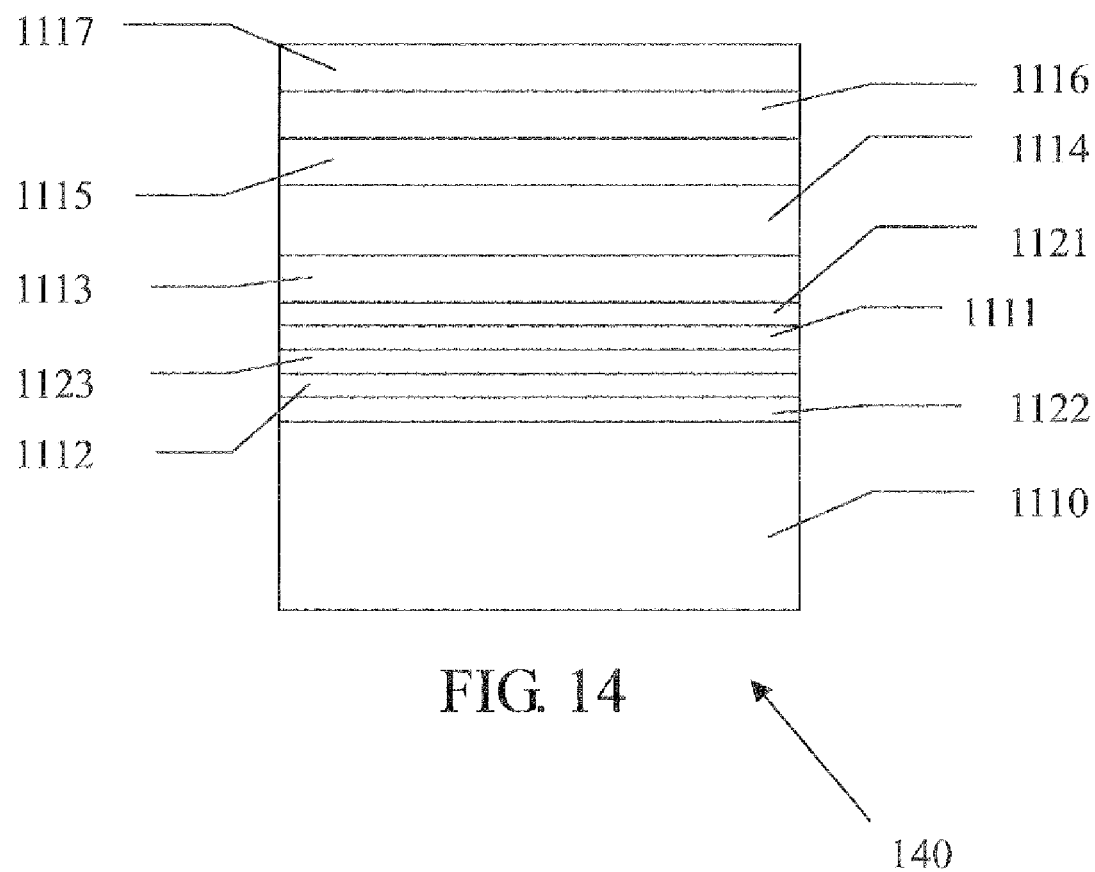
FIG. 14 is a schematic diagram showing a tenth stack formed, after adhesive binding the first stack and the second stack and before removing the first substrate, in a method for manufacturing a light emitting diode having an adhesive layer and a reflective layer, as shown in FIG. 11, in accordance with the invention.

Referring to FIGS. 12 to 14, a method for manufacturing the light emitting diode 110 comprises the following steps: forming, in sequence, on a first substrate 1118, a second contact layer 1117, a second cladding layer 1116, an active layer 1115, a first cladding layer 1114, a first contact layer 1113, a transparent conductive layer 1121, a reflective metal layer 1111, a second reaction layer 1123 to constitute an eighth stack 120; forming a first reaction layer 1122 on a second substrate 1110 to constitute a ninth stack 130; bonding together the surface of the second reaction layer 1123 of the eighth stack 120 and the surface of the first reaction layer 1122 of the ninth stack 130 by use of a adhesive layer 1112; removing the first substrate 1118 to constitute a tenth stack 140; suitably etching the tenth stack 140 to the transparent conductive layer 1121 to form an exposed surface area of the first contact layer 1113; and forming a first electrode 1119 and a second electrode 1120 respectively on the second contact layer 1117 and the exposed surface area of the first contact layer 1113.

The first substrate 18, 718, or 1118 comprises at least a material selected from the group consisting of GaP, GaAs, and Ge. The second substrate 10 or 1110 comprises at least a material selected from the group consisting of Si, GaAs, SiC, $Al_2O_3$, glass, GaP, GaAsP, and AlGaAs. The transparent adhesive layer 12 or 1112 comprises at least a material selected from the group consisting of polyimide (PI), benzocyclobutene (BCB), perfluorocyclobutane (PFCB), and the like. The first reaction layer 22, 722, or 1122 comprises at least a material selected from the group consisting of $SiN_x$, Ti, and Cr. The second reaction layer 23, 723, or 1123 comprises at least a material selected from the group consisting of $SiN_x$, Ti, and Cr, and the like. The reflective metal substrate 710 comprises at least a material selected from the group consisting of Sn, Al, Au, Pt, Zn, Ag, Ti, Pb, Pd, Ge, Cu, AuBe, AuGe, Ni, PbSn, AuZn, and the like. The first contact layer 13, 713, or 113 comprises at least a material selected from the group consisting of GaP, GaAs, GaAsP, InGaP, AlGaInP, and AlGaAs. The reflective oxide layer 611 comprises at least a material selected from the group consisting of $SiN_x$, $SiO_2$, $Al_2O_3$, $TiO_2$, MgO, and the like. The reflective metal layer 11 or 1111 comprises at least a material selected from the group consisting of In, Sn, Al, Au, Pt, Zn, Ag, Ti, Pb, Pd, Ge, Cu, AuBe, AuGe, Ni, PbSn, AuZn, and the like. Each of the first cladding layer 14, 714, or 1114, the active layer 15, 715, or 1115, and the second cladding layer 16, 716, or 1116 comprises AlGaInP. The second contact layer 17, 717, 1117 comprises at least a material selected from the group consisting of GaP, GaAs, GaAsP, InGaP, AlGaInP, and AlGaAs. The transparent conductive layer 21, 721, or 1121 comprises at least a material selected from the group consisting of indium tin oxide, cadmium tin oxide, antimony tin oxide, zinc oxide, and zinc tin oxide.

Although the preferred embodiments of the invention has been illustrated and described in the above, it will be obvious to those skilled in the art that various modifications may be made without departing from the scope and spirit of the invention defined by the appended claims.

What is claimed is:

1. A method for manufacturing a light emitting diode comprising the steps of:

forming an LED stack over a first substrate;
forming a first reaction layer over said LED stack;
forming a reflective layer over a second substrate;
forming a second reaction layer over said reflective layer; and
holding together said first reaction layer and said second reaction layer by means of a transparent adhesive layer, wherein the first and second reaction layers enhance adhesion provided by the transparent adhesive layer;

wherein said transparent adhesive layer comprises at least a material selected from the group consisting of polyimide (PI), benzocyclobutene (BCB), and perfluorocyclobutane (PFCB); and wherein each of said first and second reaction layers comprises at least a material selected from the group consisting of SiNx, Ti, and Cr.

2. A method for manufacturing a light emitting diode according to claim 1, wherein said reflective layer is a reflective metal layer.

3. A method for manufacturing a light emitting diode according to claim 2, wherein said reflective metal layer comprises a material selected from the group consisting of In, Sn, Al, Au, Pt, Zn, Ag, Ti, Pb, Pd, Ge, Cu, AuBe, AuGe, Ni, PbSn, and AuZn.

4. A method for manufacturing a light emitting diode according to claim 1, wherein said reflective layer is a reflective oxide layer.

5. A method for manufacturing a light emitting diode according to claim 4, wherein said reflective oxide layer comprises a material selected from the group consisting of $SiN_x$, $SiO_2$, $Al_2O_3$, $TiO_2$, and MgO.

6. A method for manufacturing a light emitting diode according to claim 1, wherein forming a reflective layer over a second substrate comprises the steps of forming a semiconductor stack over said second substrate and forming a reflective layer over said semiconductor stack.

7. A method for manufacturing a light emitting diode according to claim 1, wherein the method further comprises the step of removing said first substrate.

8. A method for manufacturing a light emitting diode comprising the steps of:

forming an LED stack over a first substrate;

forming a first reaction layer over said LED stack;

forming a second reaction layer over a reflective metal substrate; and holding together said first reaction layer and said second reaction layer by means of a transparent adhesive layer, wherein the first and second reaction layers enhance adhesion provided by the transparent adhesive layer;

wherein said transparent adhesive layer comprises at least a material selected from the group consisting of polyimide (PI), benzocyclobutene (BCB), and perfluorocyclobutane (PFCB); and wherein each of said first and second reaction layers comprises at least a material selected from the group consisting of SiNx, Ti, and Cr.

9. A method for manufacturing a light emitting diode according to claim 8, wherein said reflective metal substrate comprises a material selected from the group consisting of Sn, Al, Au, Pt, Zn, Ag, Ti, Pb, Pd, Ge, Cu, AuBe, AuGe, Ni, PbSn, and AuZn.

10. A method for manufacturing a light emitting diode according to claim 8, wherein the step of forming a second reaction layer over a reflective metal substrate comprises the steps of forming a reflective layer over said reflective metal substrate and forming a second reaction layer over said reflective layer.

11. A method for manufacturing a light emitting diode according to claim 8, wherein the method further comprises the step of removing said first substrate.

12. A method for manufacturing a light emitting diode comprising the steps of;

forming an LED stack over a first substrate;

forming a first reaction layer over said LED stack;

forming a second reaction layer over a reflective means; and holding together said first reaction layer and said second reaction layer by means of a transparent adhesive layer, wherein the first and second reaction layers enhance adhesion provided by the transparent adhesive layer;

wherein said transparent adhesive layer comprises at least a material selected from the group consisting of polyimide (PI), benzocyclobutene (BCB), and perfluorocyclobutane (PFCB); and wherein each of said first and second reaction layers comprises at least a material selected from the group consisting of SiNx, Ti, and Cr.

* * * * *